(12) United States Patent
Yoshino

(10) Patent No.: US 9,099,551 B2
(45) Date of Patent: Aug. 4, 2015

(54) LATERAL HIGH-VOLTAGE TRANSISTOR AND METHOD FOR MANUFACTURING THE SAME

(71) Applicant: Mitsubishi Electric Corporation, Tokyo (JP)

(72) Inventor: Manabu Yoshino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 70 days.

(21) Appl. No.: 13/950,184

(22) Filed: Jul. 24, 2013

(65) Prior Publication Data

US 2014/0103430 A1  Apr. 17, 2014

(30) Foreign Application Priority Data

Oct. 12, 2012 (JP) ................. 2012-226555

(51) Int. Cl.
| | |
|---|---|
| H01L 29/78 | (2006.01) |
| H01L 29/66 | (2006.01) |
| H01L 27/112 | (2006.01) |
| H01L 21/04 | (2006.01) |
| H01L 21/02 | (2006.01) |

(52) U.S. Cl.
CPC ...... H01L 29/7816 (2013.01); H01L 21/02521 (2013.01); H01L 21/0465 (2013.01); H01L 27/1122 (2013.01); H01L 29/66659 (2013.01); H01L 29/7835 (2013.01)

(58) Field of Classification Search
CPC ................ H01L 27/1122; H01L 29/66659; H01L 29/7816; H01L 29/7835; H01L 21/0465
See application file for complete search history.

(56) References Cited

U.S. PATENT DOCUMENTS 6,297,534 B1  10/2001  Kawaguchi et al.

FOREIGN PATENT DOCUMENTS

JP  2000-114520 A  4/2000

*Primary Examiner* — Joseph C Nicely
(74) *Attorney, Agent, or Firm* — Studebaker & Brackett PC

(57) ABSTRACT

A lateral high-voltage transistor includes: a semiconductor substrate; a semiconductor layer being provided on one main surface of the semiconductor substrate; a source region being provided selectively in a surface of the semiconductor layer; a drain region being provided selectively in the surface of the semiconductor layer; a gate electrode provided on a part of the semiconductor layer between the source region and the drain region with interposition of the gate insulating film; and a drift region being provided selectively in the surface of the semiconductor layer. The drift region includes a stripe-shaped diffusion layer extending in parallel with a direction from the drain region toward the source region. The stripe-shaped diffusion layer includes linear diffusion layers each including stripe-shaped diffusion regions that are adjacent to each other such that double diffusion occurs in a portion where the stripe-shaped diffusion regions are adjacent to each other.

9 Claims, 14 Drawing Sheets

100

F I G . 3
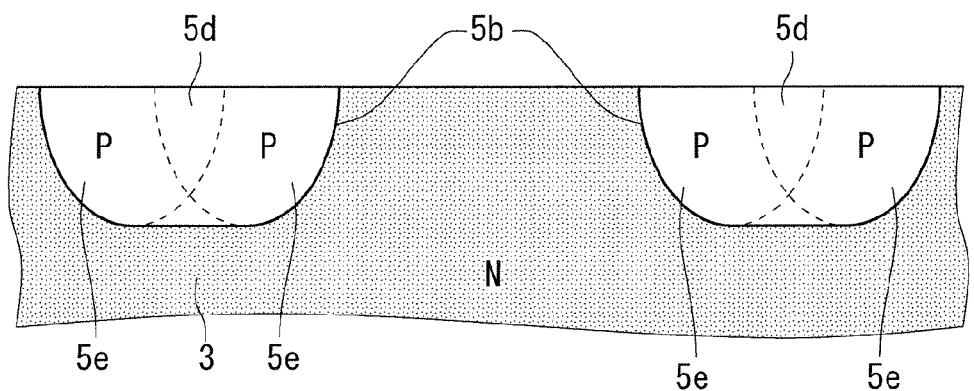
F I G . 4
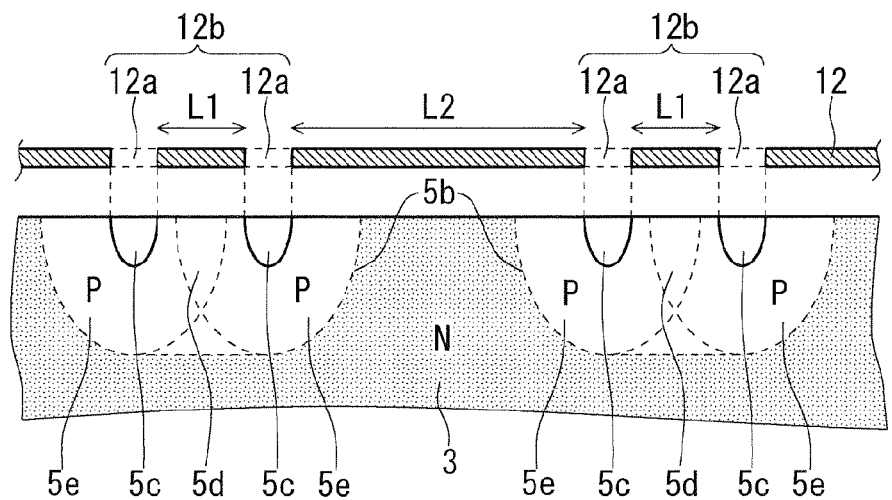

LATERAL HIGH-VOLTAGE TRANSISTOR AND METHOD FOR MANUFACTURING THE SAME

BACKGROUND OF THE INVENTION

1. Field of the Invention

The present invention relates to a lateral high-voltage transistor and a method for manufacturing the lateral high-voltage transistor.

2. Description of the Background Art

As a semiconductor device for use in, for example, power applications which requires high breakdown voltage characteristics, a lateral high-voltage transistor such as a lateral MOSFET has been known.

A conventional lateral high-voltage transistor involves a problem that, when a high voltage is applied in an OFF state, depletion of a drift region is insufficient, and breakdown voltage characteristics are deteriorated. Therefore, for example, in Japanese Patent Application Laid-Open No. 2000-114520, the drift region is formed of a stripe-shaped diffusion layer to thereby ensure depletion of the drift region, thus improving the breakdown voltage characteristics.

A conventional lateral high-voltage transistor involves a problem that, in a case where a voltage equal to or higher than a threshold voltage is applied to the gate to put the transistor into an ON state under conditions that a high voltage is applied between the drain and source, a current flowing through a channel leaks to a substrate, which reduces a drain current.

SUMMARY OF THE INVENTION

An object of the present invention is to provide a lateral high-voltage transistor that achieves both high breakdown voltage characteristics and a low leak current.

A lateral high-voltage transistor according to the present invention includes: a semiconductor substrate having a first conductive type; a semiconductor layer having a second conductive type, the semiconductor layer being provided on one main surface of the semiconductor substrate; a source region having the first conductive type, the source region being provided selectively in a surface of the semiconductor layer; and a drain region having the first conductive type, the drain region being provided selectively in the surface of the semiconductor layer such that the drain region is spaced apart from the source region. The lateral high-voltage transistor according to the present invention also includes: a gate electrode provided on a part of the semiconductor layer between the source region and the drain region with interposition of a gate insulating film such that one end of the gate electrode overlaps the source region in a plan view; and a drift region having the first conductive type, the drift region being provided selectively in the surface of the semiconductor layer such that one end of the drift region is connected to the drain region and the other end of the drift region overlaps the other end of the gate electrode in a plan view. In the lateral high-voltage transistor according to the present invention, the drift region includes a stripe-shaped diffusion layer extending in parallel with a direction from the drain region toward the source region. The stripe-shaped diffusion layer includes linear diffusion layers each including stripe-shaped diffusion regions that are adjacent to each other such that double diffusion occurs in a portion where said stripe-shaped diffusion regions are adjacent to each other.

In the present invention, impact ionization is unlikely to occur in each of the linear diffusion layers included in the stripe-shaped diffusion layer. This can reduce a leakage current. Additionally, it has been confirmed from an experiment that the present invention makes it possible to obtain an effect of reducing the leakage current without deteriorating breakdown voltage characteristics. It is considered that the impact ionization is unlikely to occur for the following reason. That is, a drain current flowing through the drift region concentrates on a surface portion of a region where double diffusion occurs and therefore the impurity concentration is high, while an electric field acting on each diffusion layer does not concentrate on the portion where the drain current concentrates.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 shows a cross-section as taken along the line segment A-A' of FIG. 2;

FIG. 4 is a diagram for explaining a method for manufacturing the lateral high-voltage transistor according to the preferred embodiment 1;

DESCRIPTION OF THE PREFERRED EMBODIMENTS

<Prerequisite Technique>
<Configuration>

Figure 15:
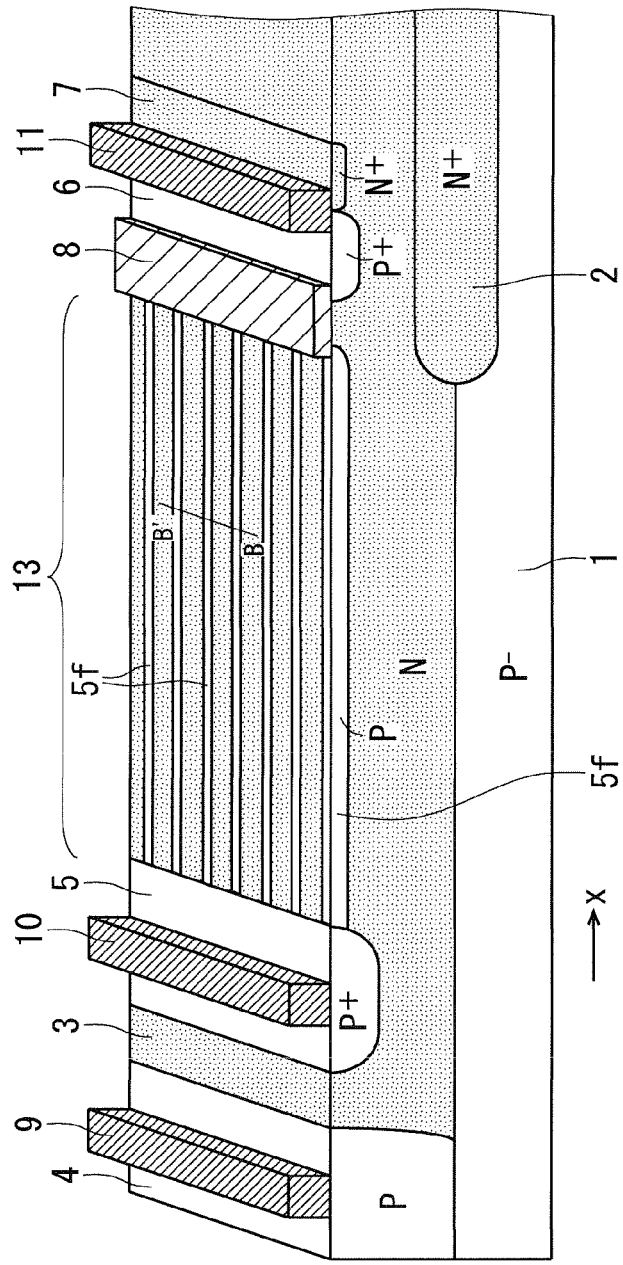
FIG. 15 is a perspective view showing a cross-section of a lateral high-voltage transistor according to a prerequisite technique.

FIG. 15 is a perspective view showing a cross-section of a lateral high-voltage transistor according to a prerequisite technique. A P-channel MOSFET will be described as an example of a conventional lateral high-voltage transistor. At a main surface side of a semiconductor substrate 1 having a first conductive type that is P-type, a semiconductor layer 3 having a second conductive type that is N-type is formed as a RESURF region. On a surface of the N-type semiconductor layer 3, a source region 6 and a drain region 5 serving as P+-type diffusion layers are formed at a distance from each other.

On a part of the semiconductor layer 3 between the source region 6 and the drain region 5, a gate electrode 8 is formed with interposition of a gate insulating film (not shown) such that one end of the gate electrode 8 overlaps the source region 6 in a plan view. The gate insulating film is made of, for example, polycrystalline silicon.

Additonally, a P-type drift region 13 is formed such that one end thereof is connected to the drain region 5 and the other end thereof overlaps the other end of the gate electrode 8 in a plan view. The drift region 13 includes a stripe-shaped P-type diffusion layer extending in parallel with a direction from the drain region 5 toward the source region 6. The stripe-shaped diffusion layer includes a plurality of linear diffusion layers 5f. Moreover, on the surface of the semiconductor layer 3, an N+-type diffusion layer 7 is formed adjacent to the source region 6.

In a region opposite to the drift region 13 relative to the drain region 5, a P-type diffusion layer 4 is formed so as to reach the semiconductor substrate 1. The semiconductor layer 3 further includes an N+-type buried diffusion layer 2 formed below the source region 6. The N+-type buried diffusion layer 2 is formed between the semiconductor layer 3 and the semiconductor substrate 1.

An insulating layer (not shown) is formed so as to cover the above-described lateral high-voltage transistor. Through contact holes provided in this insulating layer, a source electrode 11 is electrically connected to the source region 6 and the N+-type diffusion layer 7, and a drain electrode 10 is electrically connected to the drain region 5, and a wiring 9 is electrically connected to the P-type diffusion layer 4. The source electrode 11, the drain electrode 10, and the wiring 9 are electrically connected.

Figure 16:
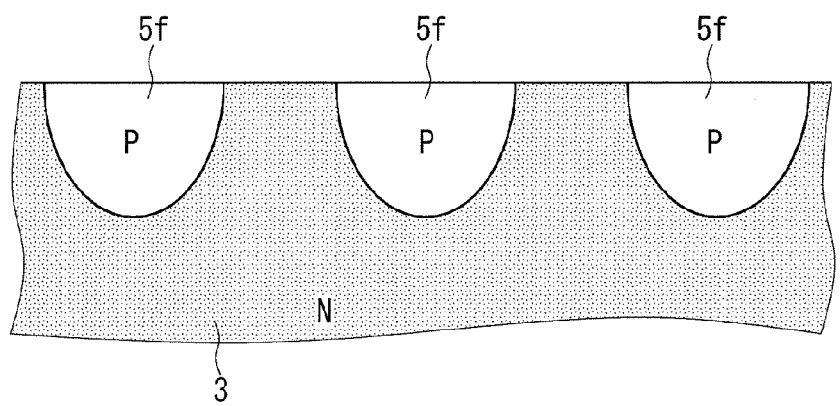
FIG. 16 shows a cross-section as taken along the line segment B-B' of FIG. 15.

FIG. 16 shows a cross-section as taken along the line segment B-B' of FIG. 15. Each of the diffusion layers 5f are formed at intervals and not connected because of diffusion.

In the lateral high-voltage transistor according to this prerequisite technique, the drift region 13 includes a stripe-shaped diffusion layer as shown in FIG. 15. Forming the drift region 13 in the shape of stripes makes it easier to completely deplete the drift region 13 than providing the drift region 13 as a uniform P-type diffusion layer not having a stripe shape. This enables an impurity concentration in the diffusion layer 5f to be increased. Thus, a resistance between the source and drain can be reduced, and the ON-resistance can be reduced.

<Operation>

Figure 17:
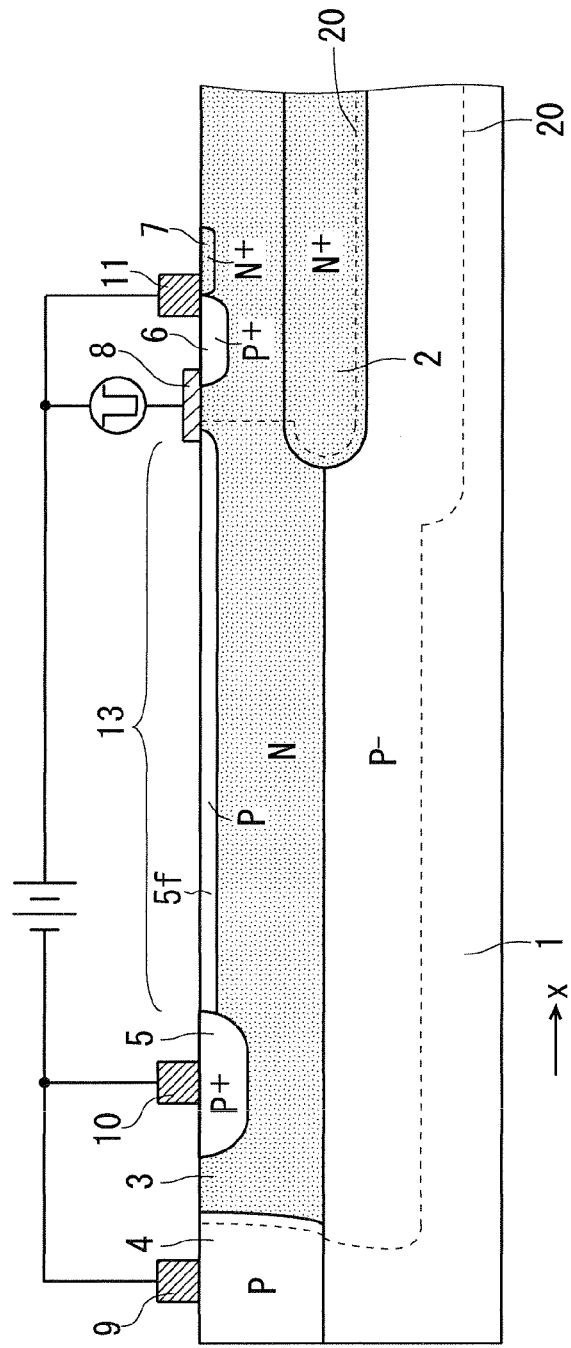
FIG. 17 is a diagram for explaining an operation of the lateral high-voltage transistor according to the prerequisite technique.

As shown in FIG. 17, when a high voltage is applied to the source electrode 11 under a state where the wiring 9 and the drain electrode 10 are set at the same potential, a depletion region 20 extends over a region inside the dotted line. That is, the drain region 5, each of the diffusion layers 5f, and most part of the semiconductor layer 3 are depleted, so that a high breakdown voltage is maintained. When, under this condition, a voltage equal to or higher than a threshold voltage is applied to the gate electrode 8, an inversion layer (channel) is formed in a part of the surface of the semiconductor layer 3 immediately below the gate insulating film, to bring the lateral high-voltage transistor into an ON state so that a drain current flows.

Figure 18:
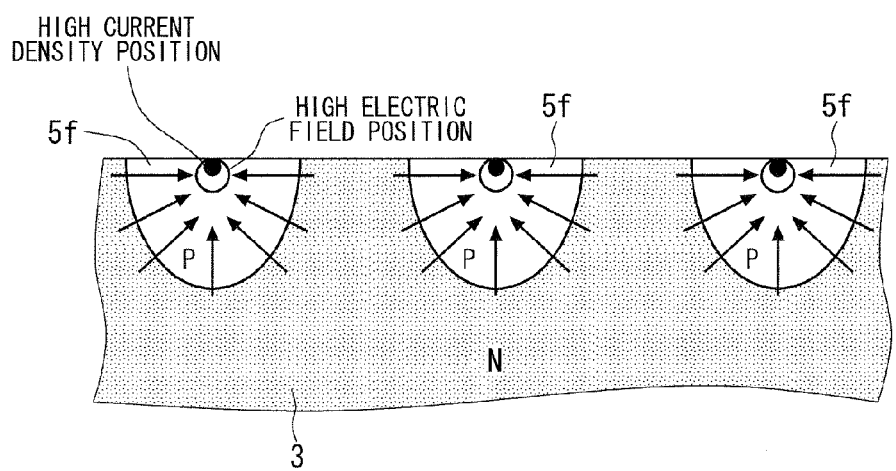
FIG. 18 shows a cross-section of the lateral high-voltage transistor according to the prerequisite technique during the operation thereof.

FIG. 18 shows a cross-section of the drift region 13 in the ON state. In each of the diffusion layers 5f, a current density is increased in a central portion of a surface of the diffusion layer 5f where an impurity concentration is low and therefore a resistance is low. On the other hand, as indiated by the arrows in FIG. 18, an electric field occurs in a direction perpendicular to a PN junction interface. Accordingly, the intensity of the electric field acting on the surface of the diffusion layer 5f concentrates on the central portion of the diffusion layer 5f. This indicates that, in each of the diffusion layers 5f, a position where the current density is high and a position where the electric field concentrates are coincident with each other.

Here, a description will be given to impact ionization, which is a phenomenon in which electron-hole pairs are caused under a high current and a high electric field. The amount G of electron-hole pairs caused by the impact ionization is represented by the following expression.

$$G = A \cdot J \exp(-B/E)$$

Here, J represents the current density, and E represents the intensity of the electric field. A and B are physical constants. The above expression reveals that the impact ionization is likely to occur when a region having a high current density and a region having a high electric field intensity overlap each other. That is, the impact ionization is likely to occur particularly in a central region of each diffusion layer 5f.

By a high voltage applied across the drain region 5 and the source region 6, holes of the electron-hole pairs caused by the impact ionization are accelerated toward the semiconductor substrate 1, to cause a leak current.

Therefore, when the lateral high-voltage transistor according to this prerequisite technique is turn on under a state where a high voltage is applied, a current leaks to the semiconductor substrate 1 even with a voltage equal to or lower than an off-breakdown voltage. As a result, in a lateral high-voltage transistor having a breakdown voltage of, for example, 600V or higher, a problem arises that a drain current is reduced. The present invention has been made to solve the above-described problem.

Preferred Embodiment 1

<Configuration>

Figure 1A:
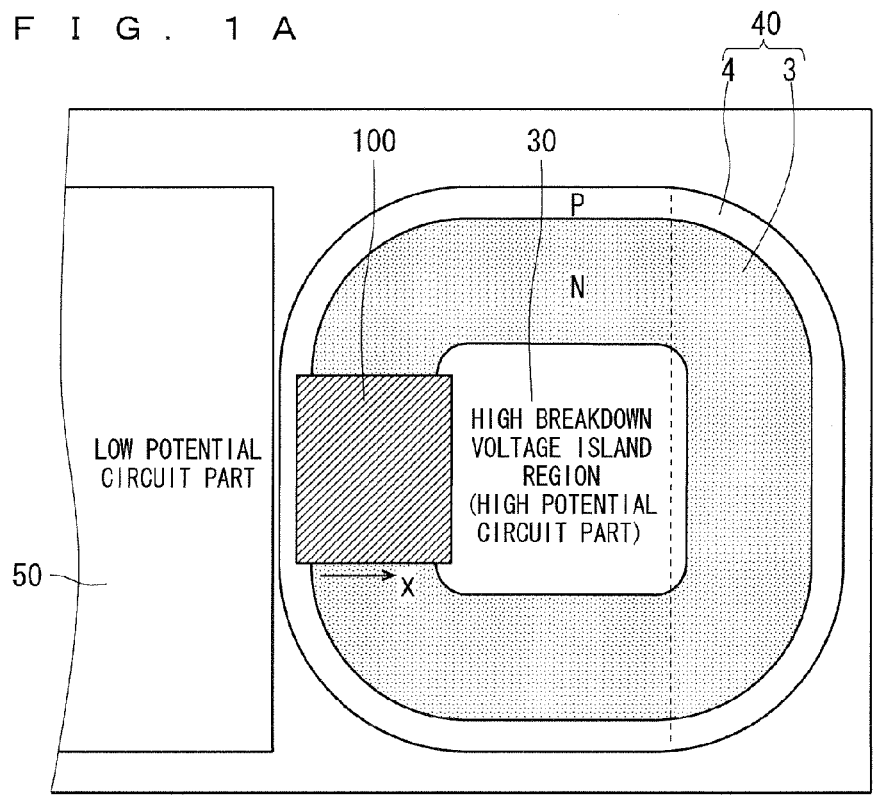
FIGS. 1A and 1B are a plan view and a cross-sectional view showing a part of an integrated circuit that includes a lateral high-voltage transistor according to a preferred embodiment 1.
Figure 1B:
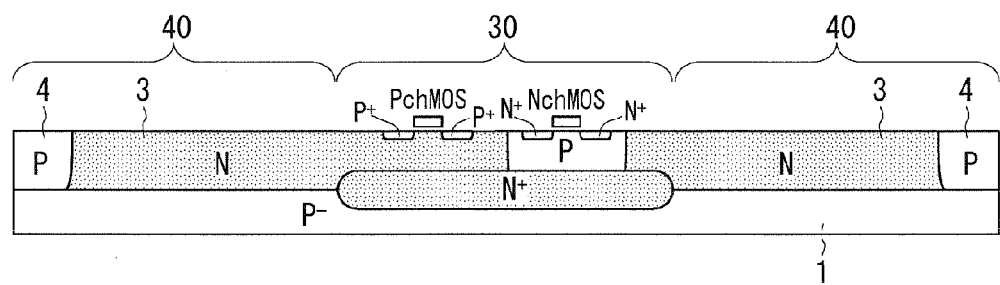

Firstly, a description will be given to an example of use of a lateral high-voltage transistor 100 according to this preferred embodiment. FIG. 1A is a plan view showing a part of an integrated circuit including the lateral high-voltage transistor 100 according to this preferred embodiment. FIG. 1B shows a cross-section as taken along the broken line of FIG. 1A. This integrated circuit is an integrated circuit having a low potential circuit part 50 and a high potential circuit part that are provided in a single chip. The high potential circuit part is formed within a high breakdown voltage island region 30.

The lateral high-voltage transistor 100 according to this preferred embodiment is used as a level-shift transistor that is necessary for a signal transmission between the high potential circuit part and the low potential circuit part 50.

In FIG. 1A, the lateral high-voltage transistor 100 is provided in a part of a high breakdown voltage isolating region 40, and achieves a signal transmission between the high potential circuit part, which is located within the high breakdown voltage island region 30, and the low potential circuit part 50 provided outside the high breakdown voltage isolating region 40.

In the high breakdown voltage island region 30, an N-channel MOSFET, a P-channel MOSFET, and the like, are provided to form the high potential circuit part, below which an N+-type buried diffusion layer 2 is provided. The N+-type buried diffusion layer 2 is formed between the high potential circuit part and a semiconductor substrate 1. By a PN junction between the semiconductor substrate 1 and the N+-type buried diffusion layer 2, a circuit within the high breakdown voltage island region 30 is electrically isolated from a voltage of the semiconductor substrate 1 with a high breakdown voltage.

In a lateral direction, the high breakdown voltage isolating region 40 that is a region where the N+-type buried diffusion layer 2 does not exist below a semiconductor layer 3 surrounds the high breakdown voltage island region 30 and serves as a high breakdown voltage isolating structure. Depletion of the high breakdown voltage isolating region 40 achieves an electrical isolation from the semiconductor substrate 1 and a P-type diffusion layer 4 with a high breakdown voltage.

Normally, a high breakdown voltage P-channel MOSFET is used as a level-shift transistor for tramitting a signal from the high potential circuit part side to the low potential circuit part 50 side. In order to transmit a signal in the reverse direction, an N-channel MOSFET is used.

Although a high voltage is applied to the high breakdown voltage island region 30 including the high potential circuit part, an N-type semiconductor layer 3 is adopted for the high breakdown voltage island region 30 because the use of the PN junction in the high breakdown voltage isolating region 40 described above. Accordingly, in a case of forming a high breakdown voltage N-channel MOSFET, a drift layer thereof is formed by using this N-type semiconductor layer. On the other hand, in a case of forming a high breakdown voltage P-channel MOSFET, the N-type semiconductor layer does not serve as a drift layer thereof and therefore it is necessary to provide a P-type diffusion layer on a surface. The present invention is directed to a lateral high-voltage transistor having such a structure.

Figure 2:
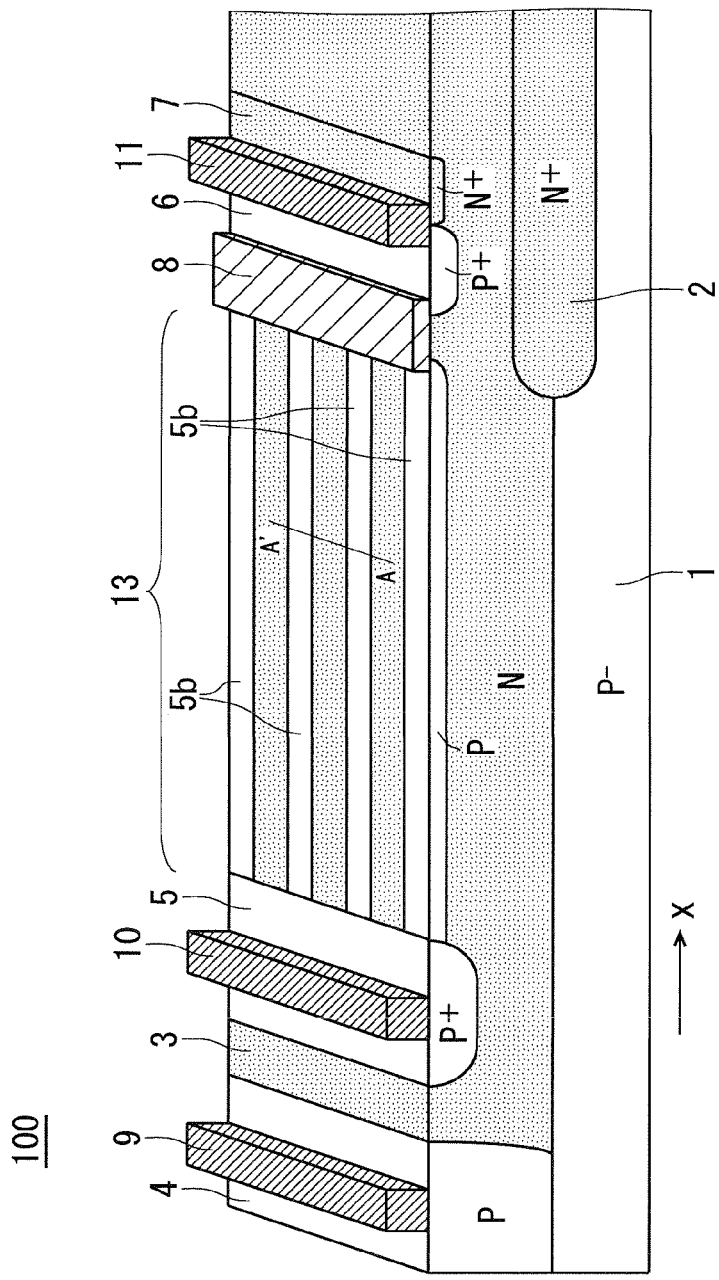
FIG. 2 is a perspective view showing a cross-section of the lateral high-voltage transistor according to the preferred embodiment 1.

FIG. 2 is a perspective view showing a cross-section of a lateral high-voltage transistor 100 according to this preferred embodiment. The lateral high-voltage transistor 100 according to this preferred embodiment is a P-channel MOSFET. In the lateral high-voltage transistor 100 according to this preferred embodiment, parts of the configuration except for a drift region 13 are the same as those of the conventional technique (FIG. 15). Therefore, a description thereof is omitted herein.

The drift region 13 has the first conductive type, that is, P-type. One end of the drift region 13 is connected to the drain region 5, and the other end thereof is formed so as to overlap the other end of the gate electrode 8 in a plan view. The drift region 13 includes a stripe-shaped P-type diffusion layer that is formed on the semiconductor layer 3 so as to extend in parallel with a direction from the drain region 5 toward the source region 6. The stripe-shaped diffusion layer includes a plurality of linear diffusion layers 5b.

FIG. 3 shows a cross-section of the drift region 13 as taken along the line segment A-A' of FIG. 2. As shown in FIG. 3, each of the diffusion layers 5b includes stripe-shaped diffusion regions 5e that are adjacent to each other. A portion where they are adjacent to each other constitutes an overlap diffusion region 5d. In this specification, the overlap diffusion region 5d means a region where adjacent diffusion regions 5e overlap each other, that is, a region where double diffusion occurs.

<Manufacturing Method>

A method for manufacturing the lateral high-voltage transistor 100 according to this preferred embodiment will be described. Particularly, a step of forming the drift region 13 will be detailed.

Firstly, for example, a P-type silicon substrate is prepared as the P-type semiconductor substrate 1. Then, impurities are ion-implanted into a main surface of the semiconductor substrate 1, to form the semiconductor layer 3 having the second conductive type that is N-type. It may be also acceptable to form an epitaxial layer on the P-type silicon substrate to serve as the semiconductor layer 3.

Then, a surface of the semiconductor layer 3 is selectively ion-implanted by using a mask 12, and subsequently a heat treatment is performed, to thereby form the diffusion layers 5b (see FIG. 4). This step will be described more.

As shown in FIG. 4, the mask 12 used for the ion-implantation has a plurality of slit groups 12b that are formed at regular intervals L2. Each of the slit groups 12b includes two slits 12a that are formed at a regular interval L1. Each of the slits 12a has a length equal to the length of the drift region 13 with respect to the direction perpendicular to the drawing sheet of FIG. 4, and each of the slits 12a continuously extends in the direction perpendicular to the drawing sheet of FIG. 4.

By using the mask 12 described above, the ion-implantation is performed on the semiconductor layer 3. As a result, ion-implantation regions 5c are formed in portions of the surface of the semiconductor layer 3 corresponding to the slits 12a.

Then, the heat treatment is performed, to diffuse the impurities in the ion-implantation regions 5c, thus forming the diffusion layers 5b as shown in FIG. 3. At this stage, the impurities in the respective ion-implantation regions 5c are diffused to form the diffusion regions 5e. The diffusion regions 5e partially overlap each other, to result in the overlap diffusion region 5d.

That is, the interval L1 between the slits 12a of each slit group 12b is such an interval that adjacent diffusion regions 5e are connected. The interval L2 between adjacent slit groups 12b is such an interval that adjacent diffusion layers 5b are not connected.

In this preferred embodiment, the interval between adjacent slit groups 12b is set to be a regular interval of L2. However, this interval may not be regular as long as it is such an interval that adjacent diffusion layers 5b are not connected. Additionally, although in this preferred embodiment, the interval between adjacent slits 12a of each slit group 12b is set to be a regular interval of L1. However, this interval may not be regular as long as it is such an interval that adjacent diffusion regions 5e are connected.

The steps for forming the regions other than the drift region 13 are the same as the steps performed in manufacturing an ordinary conventional P-channel MOSFET. Therefore, a description thereof is omitted herein.

<Operation>

An operation of the lateral high-voltage transistor 100 according to this preferred embodiment will be described. A basic operation of the lateral high-voltage transistor 100 has been described in the conventional technique, and therefore a description thereof is omitted herein.

In each of the diffusion layers 5b shown in FIGS. 3 and 4, the overlap diffusion region 5d has a high impurity concentration. Accordingly, it is considered that the current density of a drain current is high in a surface portion of the overlap diffusion region 5d. On the other hand, an electric field occurs in a direction perpendicular to a PN junction interface, and it is considered that the concentration of the electric field on a specific region is relieved as compared with the prerequisite technique (FIG. 18).

More specifically, in the lateral high-voltage transistor 100 according to this preferred embodiment, it is assumed that the electric field does not concentrate on a region of each diffusion layer 5b having a high current density. Therefore, it is considered that the impact ionization is unlikely to occur as compared with the prerequisite technique. For this reason, this preferred embodiment can reduce leakage of a drain current to a substrate.

Figure 5:
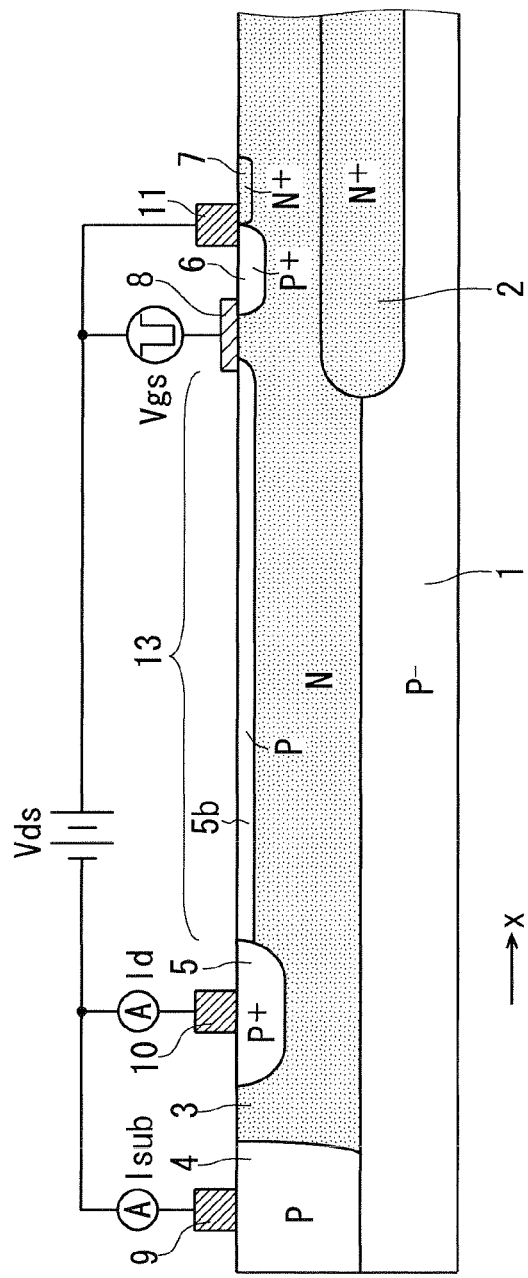
FIG. 5 is a diagram showing a method for measuring a drain current and a substrate current of the lateral high-voltage transistor according to the preferred embodiment 1.

The inventors have measured a substrate current, that is, a leakage current, in order to confirm the above-described effects of the invention. FIG. 5 shows an outline of the measuring method. As shown in FIG. 5, a pulse voltage was applied to the gate electrode 8 under a state where high voltages having the same potential were applied to the drain region 5 and the semiconductor substrate 1 relative to the source region 6. Thus, the P-channel MOSFET is turned on. At this this, a drain current Id flowing through the drain region 5 and the diffusion layers 5b and a substrate current Isub, that is, a leakage current, flowing through the semiconductor substrate 1 and the diffusion layer 4, were measured.

Figure 6:
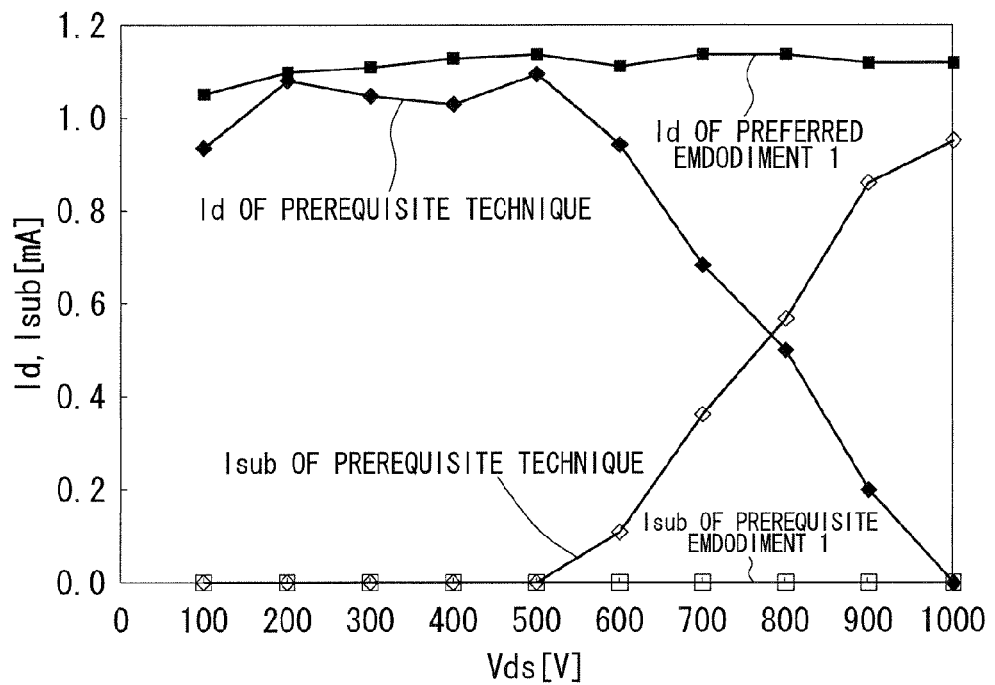
FIG. 6 is a diagram showing drain-source voltage dependencies of a drain current and a substrate current of the lateral high-voltage transistor according to the preferred embodiment 1.

FIG. 6 shows dependencies, on a drain-source voltage Vds, of the drain current Id and the substrate current Isub obtained as a result of the measurement, in cases of this preferred embodiment and the prerequisite technique.

In the prerequisite technique, at or around a time when the drain-source voltage Vds exceeded 500V, the drain current Id decreased along with an increase in the drain-source voltage Vds, and at or around a time when the drain-source voltage Vds was about 1000V, the drain current Id become zero. Along with a decrease in the drain current Id, the substrate current Isub, that is, the leakage current, increased.

In this preferred embodiment, on the other hand, unlike the prerequisite technique, the drain current Id did not decrease even though the drain-source voltage Vds increased. Additionally, the substrate current Isub, that is, the leakage current, was almost zero irrespective of the drain-source voltage Vds.

From a result of the measurement above, it has been confirmed that the lateral high-voltage transistor 100 according to this preferred embodiment is able to reduce the leakage current even when the drain-source voltage Vds is a high voltage of, for example, 600V or higher, as compared with the prerequisite technique.

The inventors have also conducted a measurement for examining the relationship between the width of the slit 12a of the mask 12 used for manufacturing the lateral high-voltage transistor 100 according to this preferred embodiment and the breakdown voltage of the lateral high-voltage transistor 100. A result thereof is shown in FIG. 7.

Figure 7:
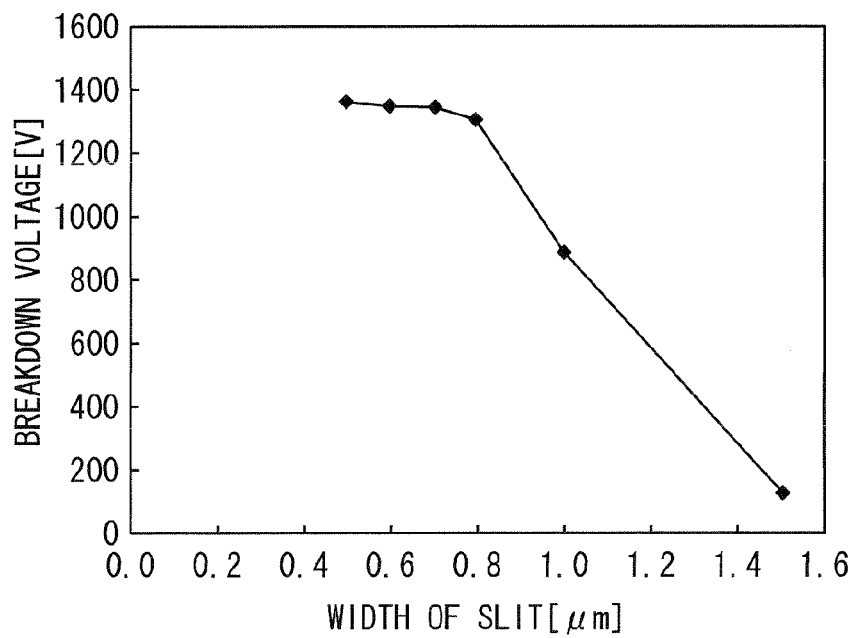
FIG. 7 is a diagram showing the relationship between the breakdown voltage and the width of a slit of a mask that is used for manufacturing the lateral high-voltage transistor according to the preferred embodiment 1.

FIG. 7 reveals that the breakdown voltage is improved along with a decrease in the width of the slit 12a, and setting the width of the slit 12a to be 1 μm or less provides a high breakdown voltage of 600V or higher.

The inventors have also conducted a simulation to examine an impurity concentration distribution in the diffusion layer 12b of the drift region 13 in each of the lateral high-voltage transistor 100 according to this preferred embodiment and the lateral high-voltage transistor according to the prerequisite technique. A result thereof is shown in FIGS. 8 to 10.

Figure 8:
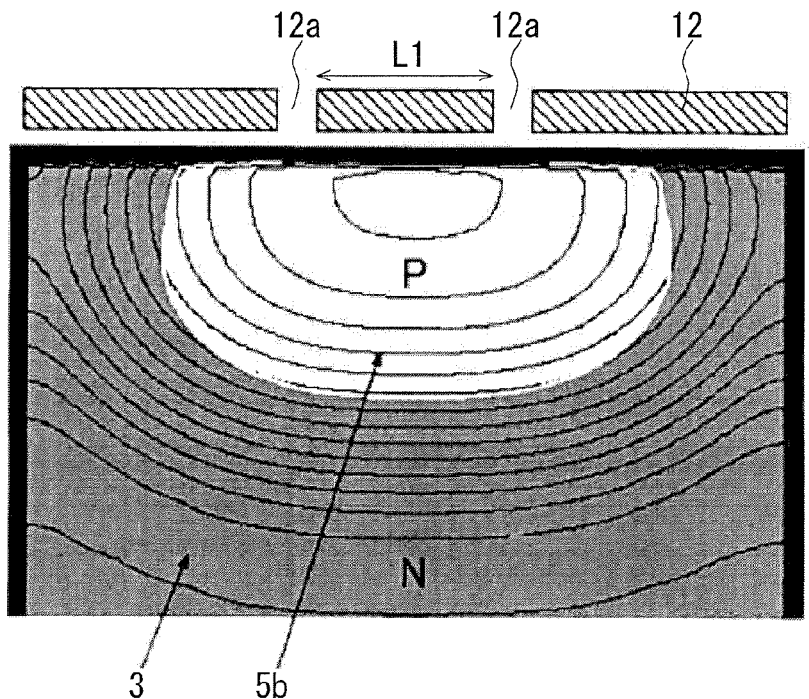
FIG. 8 is a diagram showing an impurity concentration distribution in a drift region of the lateral high-voltage transistor according to the preferred embodiment 1.

FIG. 8 shows an impurity concentration distribution corresponding to FIG. 3. In FIG. 8, the interval L1 between the slits 12a is set such that the adjacent diffusion regions 5e are connected to form the diffusion layer 5b and additionally the overlap diffusion region 5d (in FIG. 8, an intermediate region between the adjacent slits 12a) has the highest impurity concentration. A boundary between a white region and a gray region represents a PN junction interface, which is true for FIGS. 9 and 10, too. Providing the impurity concentration distribution and the shape of the PN junction interface as shown in FIG. 8 successfully exerts an effect of reducing a leakage current.

Figure 9:
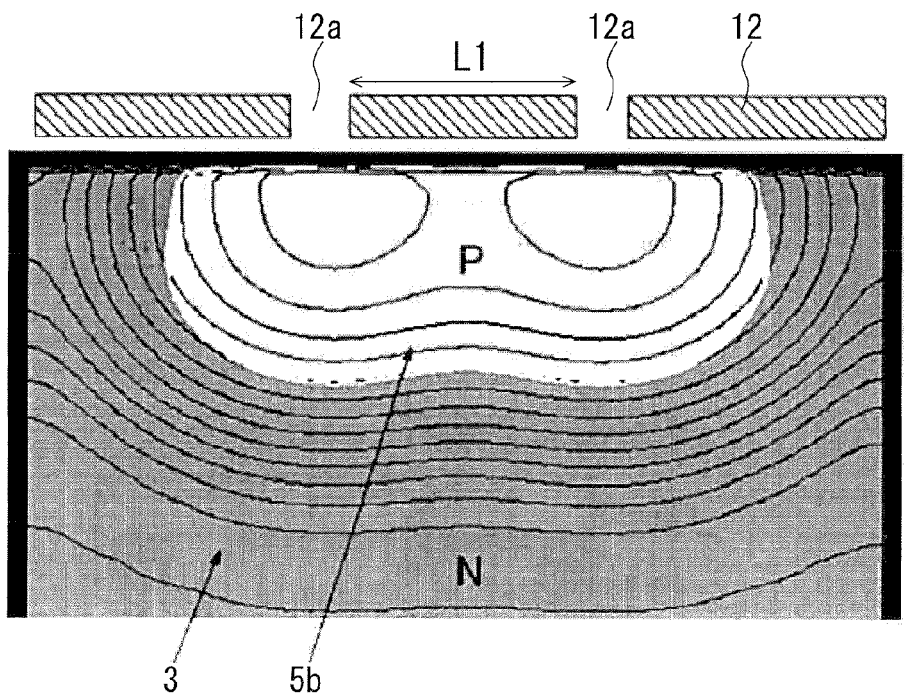
FIG. 9 is a diagram showing an impurity concentration distribution obtained when an slit interval L1 of the mask is increased as compared with a case shown in FIG. 8.

FIG. 9 shows an impurity concentration distribution obtained when the interval L1 between the slits 12a is set such that the impurity concentration is higher in a region below each slit 12a than in the overlap diffusion region 5d. In this case, the interval L1 between the slits 12a is larger than in the case shown in FIG. 8. Providing the impurity concentration distribution as shown in FIG. 9 exerts an effect of reducing a leakage current, but such an effect is smaller than the effect obtained by the impurity concentration distribution as shown in FIG. 8. Therefore, it is desirable to set the interval L1 between the slits 12a such that the impurity concentration distribution as shown in FIG. 8 is obtained.

Figure 10:
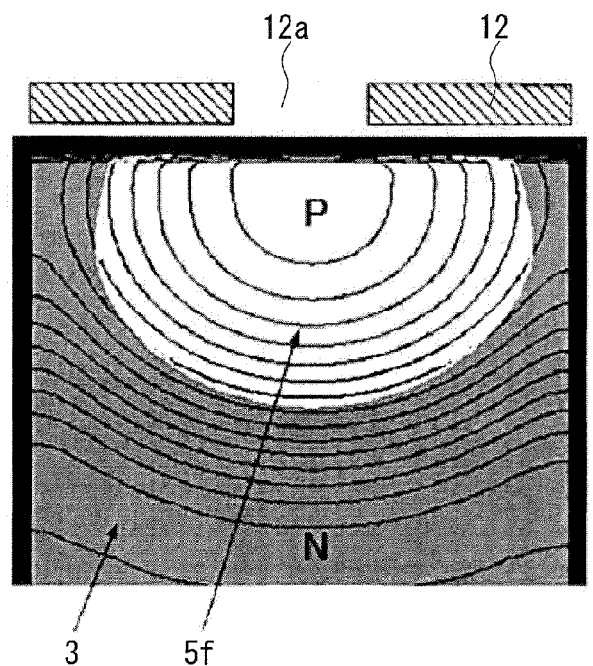
FIG. 10 is a diagram showing an impurity concentration distribution in a drift region of a lateral high-voltage transistor according to a prerequisite technique.

FIG. 10 shows an impurity concentration distribution in the drift region 13 of the lateral high-voltage transistor according to the prerequisite technique (corresponding to the schematic diagrams shown in FIGS. 16 and 18). In the prerequisite technique, unlike this preferred embodiment, one slit is used to form one diffusion layer 5f. Providing the concentration distribution as shown in FIG. 10 causes a leakage current upon a high voltage of, for example, 600V or higher, as described in the prerequisite technique.

<Effects>

The high-voltage transistor according to this preferred embodiment includes: the semiconductor substrate 1 having the first conductive type; the semiconductor layer 3 having the second conductive type, the semiconductor layer 3 being provided on one main surface of the semiconductor substrate 1; the source region 6 having the first conductive type, the source region 6 being provided selectively in the surface of the semiconductor layer 3; the drain region 5 having the first conductive type, the drain region 5 being provided selectively in the surface of the semiconductor layer 3 such that the drain region 5 is spaced apart from the source region 6; the gate electrode 8 provided on a part of the semiconductor layer 3 between the source region 6 and the drain region 5 with interposition of the gate insulating film such that one end of the gate electrode 8 overlaps the source region 6 in a plan view; and the drift region 13 having the first conductive type, the drift region 13 being provided selectively in the surface of the semiconductor layer 3 such that one end of the drift region 13 is connected to the drain region 5 and the other end of the drift region 13 overlaps the other end of the gate electrode 8 in a plan view. The drift region 13 includes a stripe-shaped diffusion layer extending in parallel with a direction from the drain region 5 toward the source region 6. The stripe-shaped diffusion layer includes linear diffusion layers 5b each including stripe-shaped diffusion regions 5e that are adjacent to each other such that double diffusion occurs in the portion where the stripe-shaped diffusion regions 5e are adjacent to each other.

Accordingly, in the above-described configuration, the impact ionization is unlikely to occur in each diffusion layer 5b. This can reduce the leakage current. It has been confirmed from an experiment that it is possible to obtain an effect of reducing the leakage current without deteriorating breakdown voltage characteristics. It is considered that, in the lateral high-voltage transistor 100 according to this preferred embodiment, the impact ionization is unlikely to occur for the following reason. That is, the drain current flowing through each diffusion layer 5b of the drift region 13 concentrates on the surface portion of the overlap diffusion region 5d having a high impurity concentration, while the electric field acting on each diffusion layer 5b does not concentrate on a portion where the drain current concentrates.

In the high-voltage transistor according to this preferred embodiment, the semiconductor layer 3 may be an epitaxial layer, as mentioned above.

Accordingly, in a case where the semiconductor layer 3 is an epitaxial layer, the ion-implantation step can be omitted, because the N-type semiconductor layer 3 is formed on the P-type semiconductor substrate 1 by epitaxial growth instead of the ion-implantation.

In the lateral high-voltage transistor 100 according to this preferred embodiment, the first conductive type is P-type, and the second conductive type is N-type.

Accordingly, the lateral high-voltage transistor 100 according to this preferred embodiment is a transistor of P-channel type. Therefore, the lateral high-voltage transistor 100 can be used as a transistor that is suitable for a signal transmission from the high potential circuit to the low potential circuit. This enlarges a range of a circuit to which the lateral high-voltage transistor 100 according to this preferred embodiment is applicable, and also can simplify a circuit configuration. Thus, a wide range of circuit configurations can be integrated witin a single chip, and, as a whole, the number of parts can be reduced. This is useful particularly in a case where the lateral high-voltage transistor 100 is integrated in the same chip as the chip where the high potential circuit and the low potential circuit are integrated.

The method for manufacturing the lateral high-voltage transistor 100 according to this preferred embodiment includes the steps of: (a) preparing the semiconductor substrate 1; (b) forming the semiconductor layer 3 on one main surface of the semiconductor substrate 1; (c) covering the semiconductor layer 3 with the mask 12 and performing the ion-implantation; and (d) after the step (c), performing the heat treatment to form the diffusion layer 5b. In the method for manufacturing the lateral high-voltage transistor 100 according to this preferred embodiment, the mask 12 includes the plurality of slit groups 12b formed at an interval equal to or larger than the interval L2. Each of the slit groups 12b includes the plurality of slits 12a formed at an interval equal to or less than the interval L1. The interval L1 is such an interval that the diffusion regions 5e corresponding to the adjacent slits 12a are connected in the step (d). The interval L2 is such an interval that the diffusion layers 5b corresponding to the adjacent slit groups 12b are not connected in the step (d).

Accordingly, through the above-mentioned steps, the drift region 13 can be formed, and therefore the lateral high-voltage transistor 100 according to this preferred embodiment can be manufactured.

In the method for manufacturing the lateral high-voltage transistor 100 according to this preferred embodiment, the interval between the slit groups 12b is set to be a constant value equal to or greater than L2, and the interval between the slits 12a is set to be a constant value equal to or less than L1.

Accordingly, since the interval between the slit groups 12b and the interval between the slits 12a are set to be constant values, the diffusion layer 5b is periodically formed in the drift region 13. This makes it easier to design the lateral high-voltage transistor 100, as compared with a case where the interval of the diffusion layers 5b is not constant.

In the method for manufacturing the lateral high-voltage transistor 100 according to this preferred embodiment, the slit 12a provided in the mask 12 has a width of 1 μm or less.

Accordingly, setting the width of the slit 12a to be 1 μm or less enables manufacturing of a lateral high-voltage transistor having high breakdown voltage characteristics of 600V or higher.

Preferred Embodiment 2

Configuration

In the preferred embodiment 1, each of the diffusion layers 5b includes two stripe-shaped diffusion regions 5e that are adjacent to each other. In this preferred embodiment, on the other hand, each of the diffusion layers 5b includes three stripe-shaped diffusion regions 5e that are adjacent to one another. The other parts of the configuration are the same as those of the preferred embodiment 1 (FIG. 2). Therefore, a description thereof is omitted herein.

Figure 11:
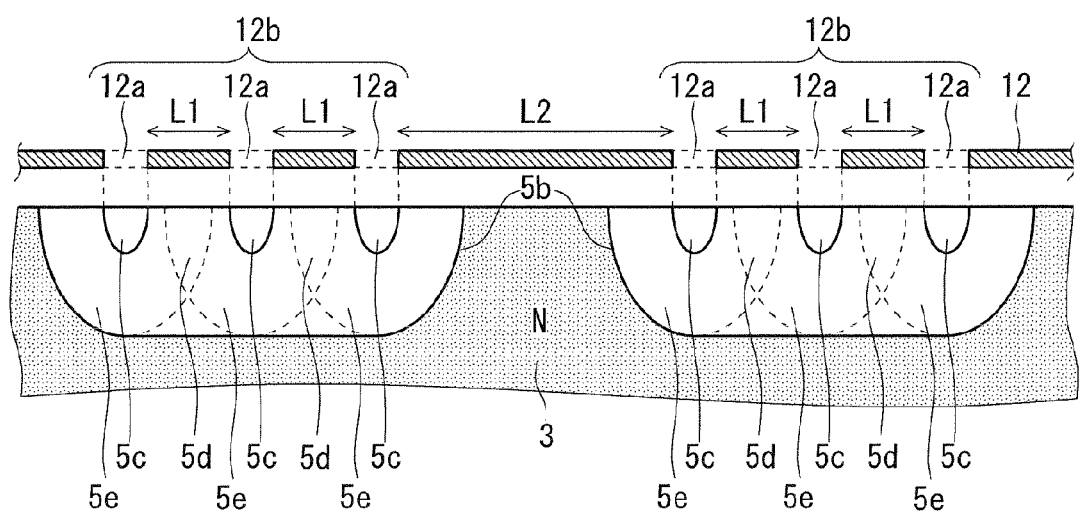
FIG. 11 is a diagram showing a structure of a lateral high-voltage transistor according to a preferred embodiment 2, and a method for manufacturing it.

FIG. 11 shows a cross-section of the drift region 13 of the lateral high-voltage transistor 100 according to this preferred embodiment. Each of the diffusion layers 5b includes three stripe-shaped diffusion regions 5e that are adjacent to one another. An overlap diffusion region 5d exists in a portion between adjacent diffusion regions 5e.

In a process for manufacturing the high-voltage transistor 100 according to this preferred embodiment, similarly to the preferred embodiment 1, the mask 12 used in the ion-implantation step has a plurality of slit groups 12b that are formed at regular intervals L2. Each of the slit groups 12b includes three slits 12a that are formed at regular intervals L1. The other steps in the manufacturing process are the same as those of the preferred embodiment 1, and therefore a description thereof is omitted herein.

In this preferred embodiment, the number of diffusion regions 5e provided in each diffusion layer 5b is three. However, the number of diffusion regions 5e is not limited to three as long as it is two or more. Such a configuration can also exert the same effects as those described in the preferred embodiment 1.

Preferred Embodiment 3

Configuration

In a process for manufacturing the lateral high-voltage transistor 100 according to this preferred embodiment, the mask 12 used for ion-implantation into the drift region 13 has a plurality of slits 12a that are formed intermittently with respect to the direction in which the slits of the preferred embodiment 1 extend, that is, with respect to an x direction shown in FIG. 2. An interval of intermittence with respect to the direction in which the slits 12a extend are such intervals that, in the heat treatment step, at least the diffusion regions are connected in the direction in which the slits extend.

Figure 12A:
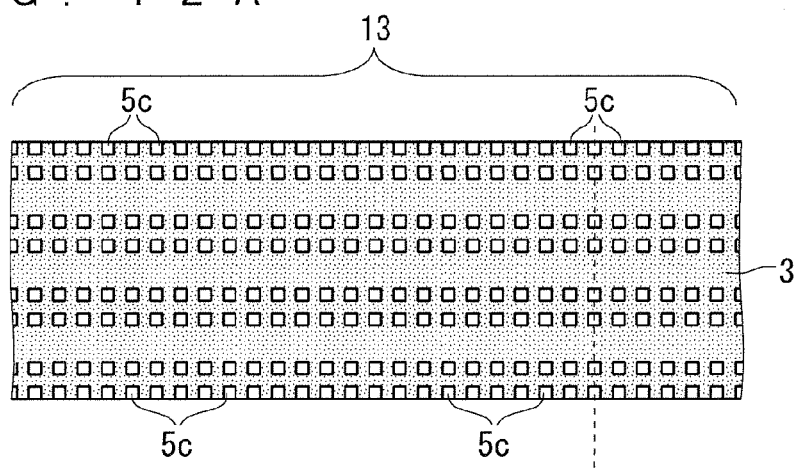
FIGS. 12A and 12B are diagrams showing a method for manufacturing a lateral high-voltage transistor according to a preferred embodiment 3 and a structure thereof.

FIG. 12A is a plan view showing the drift region 13 obtained after the ion-implantation step in the process for manufacturing the high-voltage transistor 100 according to this preferred embodiment. As a result of the ion-implant step, the ion-implantation regions 5c are formed intermittently with respect to the direction in which the slits extend, that is, with respect to the x direction. At this time, an impurity concentration in the ion-implantation region 5c is higher than that of the preferred embodiment 1. The intervals of the ion-implantation regions 5c in the x direction are adjusted such that a desired concentration is obtained after diffusion is caused by the subsequent heat treatment.

Figure 12B:
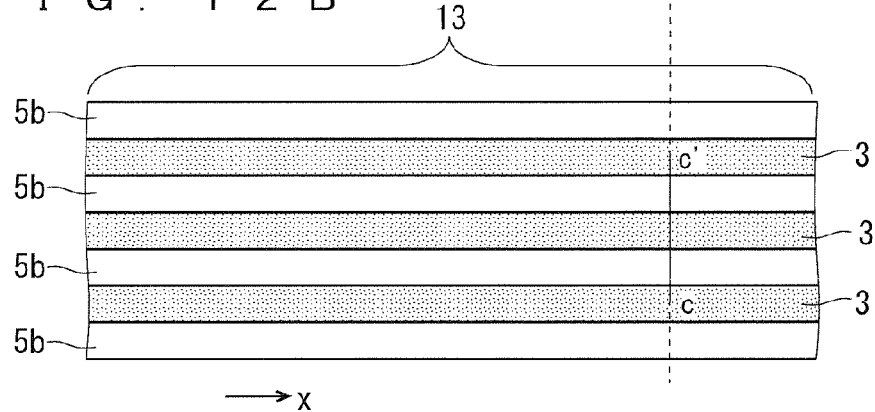

Then, the heat treatment is performed, to cause diffusion in the ion-implantation region 5c. Thus, as shown in FIG. 12B, the diffusion regions are connected in the direction of the stripe, to form the diffusion layer 5b. Similarly to the preferred embodiment 1, adjacent stripe-shaped diffusion regions 5c that are formed intermittently in each diffusion layer 5b are connected to each other, to form the overlap diffusion region 5d. Accordingly, a cross-sectional view as taken along the line segment C-C' of FIG. 12B is identical to the cross-sectional view of FIG. 3 showing the preferred embodiment 1.

<Effects>

In the method for manufacturing the lateral high-voltage transistor 100 according to this preferred embodiment, the plurality of slits 12a are formed intermittently with respect to the direction in which the slits 12a extend. The interval of intermittence of the slits 12a is such an interval that, in the heat treatment step, at least the diffusion layers 5b are connected in the direction in which the slits 12a extend. Accordingly, the diffusion layers 5b are connected in the direction in which the slits 12a extend. Therefore, the same effects as those described in the preferred embodiment 1 can be exerted.

Preferred Embodiment 4

In the lateral high-voltage transistors 100 according to the preferred embodiments 1 to 3, the semiconductor layer 3 in which the source region 6 is formed is the same as the semiconductor layer 3 that forms the high breakdown voltage island region (see FIGS. 1A and 1B). Therefore, they are not electrically isolated from each other.

Figure 13:
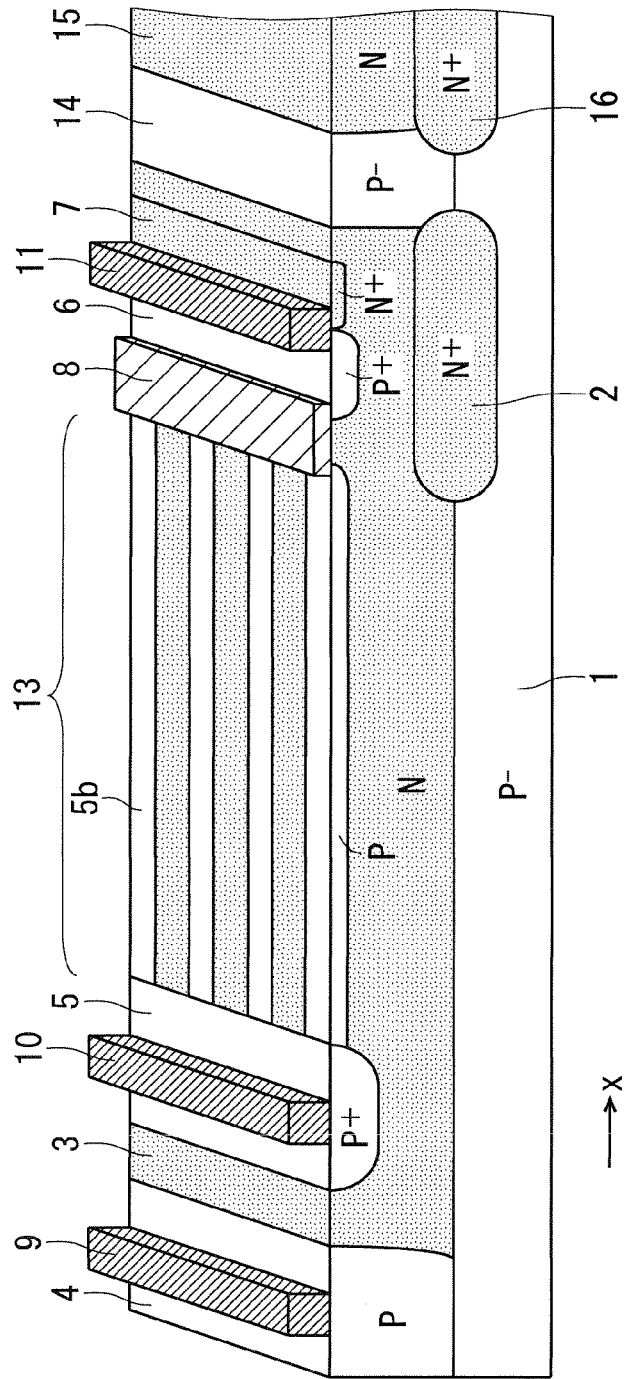
FIG. 13 is a perspective view showing a cross-section of a lateral high-voltage transistor according to a preferred embodiment 4.

In this preferred embodiment, as shown in FIG. 13, an N-type semiconductor layer 15 in the high breakdown voltage island region and the N-type semiconductor layer 3 of the lateral high-voltage transistor are isolated from each other by a P-type semiconductor layer 14 serving as an epitaxial layer.

That is, the semiconductor layer 3 is isolated by the semiconductor layer 14 having the first conductive type that is P-type at the side opposite to the gate electrode 8 relative to the source region 6. Accordingly, the source region 6 is electrically isolated from the semiconductor layer 15 within the high breakdown voltage island region.

Since the semiconductor layer 3 is isolated by the P-type semiconductor layer 14, the N+-type buried diffusion layer provided in the semiconductor layer 3 is divided into the buried diffusion layer 2 and the buried diffusion layer 16 that are isolated from each other.

In the lateral high-voltage transistor 100 according to this preferred embodiment, the semiconductor layer 3 is isolated by the semiconductor layer 14 having the first conductive type that is P-type at the side opposite to the gate electrode 8 relative to the source region 6.

Accordingly, forming the semiconductor layer 14 causes an electrical isolation between the source region 6 and the semiconductor layer 15 (FIG. 13) within the high breakdown voltage island region 30. Therefore, even in a case where the lateral high-voltage transistor 100 according to this preferred embodiment is provided in the high breakdown voltage isolating region 40 shown in FIGS. 1A and 1B, different potentials can be adopted as a power source potential of the high voltage circuit part provided within the high breakdown voltage island region 30 and a source potential of the lateral high-voltage transistor 100. This makes it possible that, for example, a circuit such as a constant current source is provided between the source electrode 11 of the lateral high-voltage transistor 100 and a power source of the high potential circuit part. Therefore, the degree of freedom in the design of an integrated circuit is increased. Additionally, this enables a larger number of semiconductor devices to be integrated in a single integrated circuit. Thus, as a whole, the number of parts can be reduced.

Preferred Embodiment 5

Figure 14:
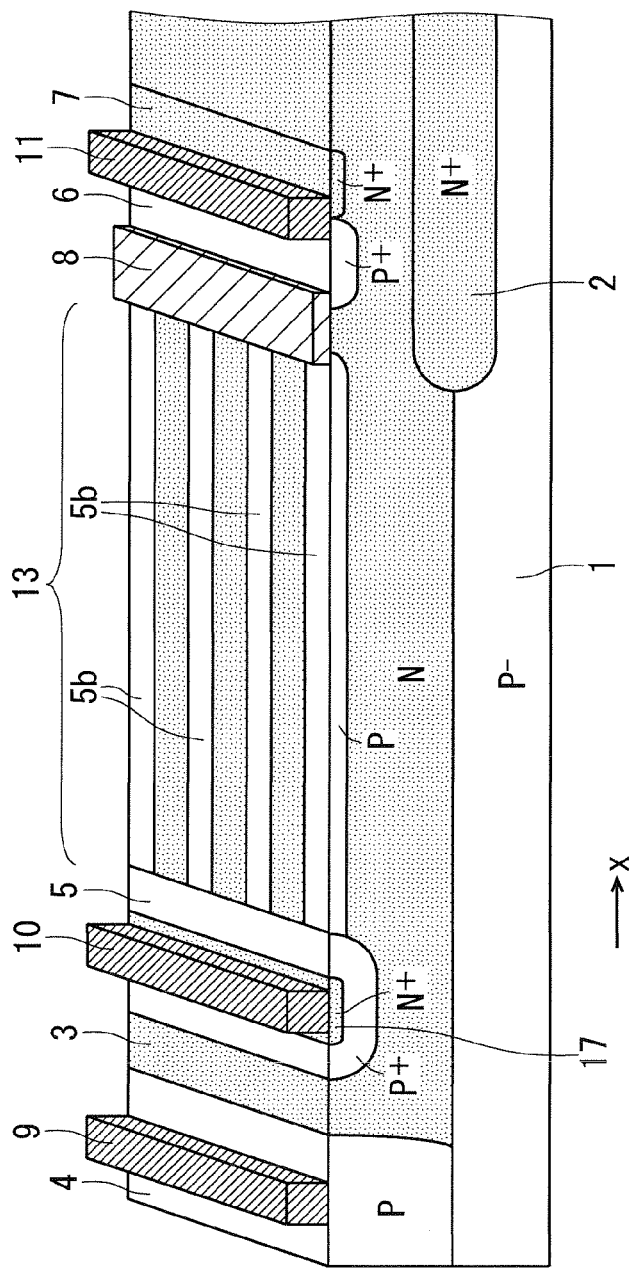
FIG. 14 is a perspective view showing a cross-section of a lateral high-voltage transistor according to a preferred embodiment 5.

FIG. 14 is a perspective view showing a cross-section of the lateral high-voltage transistor 100 according to this preferred embodiment. The lateral high-voltage transistor 100 according to this preferred embodiment further includes an N-type diffusion layer 17 provided in a surface of the drain region 5. The other parts of the configuration are the same as those of the preferred embodiment 1 (FIG. 2). Therefore, a description thereof is omitted herein.

As shown in FIG. 14, the N-type diffusion layer 17 is formed in the surface of the P-type drain region 5, to form a P-channel IGBT. Thereby, a resistance of the drain region 5 is reduced due to a conductivity modulation, and the ON-resistance of the lateral high-voltage transistor can be reduced.

In the lateral high-voltage transistor 100 according to this preferred embodiment, the diffusion layer 17 having the second conductive type that is N-type is further provided in the surface of the drain region 5.

Accordingly, the diffusion layer 17 having the second conductive type that is N-type is provided in the surface of the drain region 5, to form a P-channel IGBT. Thereby, the ON-resistance can be reduced.

In the preferred embodiments of the present invention, a P-channel MOSFET or a P-channel IGBT has been taken as an example, and the structure and manufacturing method thereof have been described. Instead, the present invention is also applicable to a case of the opposite conductive type, that is, to an N-channel MOSFET or an N-channel IGBT.

The preferred embodiments of the present invention can be freely combined, modified, or omitted as appropriate within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A lateral high-voltage transistor comprising:
 a semiconductor substrate having a first conductive type;
 a semiconductor layer having a second conductive type, said semiconductor layer being provided on one main surface of said semiconductor substrate;
 a source region having the first conductive type, said source region being provided selectively in a surface of said semiconductor layer;
 a drain region having the first conductive type, said drain region being provided selectively in the surface of said semiconductor layer such that said drain region is spaced apart from said source region;
 a gate electrode provided on a part of said semiconductor layer between said source region and said drain region with interposition of a gate insulating film such that one end of said gate electrode overlaps said source region in a plan view; and a drift region having the first conductive type, said drift region being provided selectively in the surface of said semiconductor layer such that one end of said drift region is connected to said drain region and the other end of said drift region overlaps the other end of said gate electrode in a plan view, wherein said drift region includes a stripe-shaped diffusion layer extending in parallel with a direction from said drain region toward said source region, said stripe-shaped diffusion layer includes linear diffusion layers each including stripe-shaped diffusion regions that are adjacent to each other such that double diffusion occurs in a portion where said stripe-shaped diffusion regions overlap each other.

2. The lateral high-voltage transistor according to claim 1, wherein
said semiconductor layer is an epitaxial layer.

3. The lateral high-voltage transistor according to claim 1, wherein
said semiconductor layer is isolated by a semiconductor layer having the first conductive type at the side opposite to said gate electrode relative to said source region.

4. The lateral high-voltage transistor according to claim 1, further comprising a diffusion layer having the second conductive type, said diffusion layer being provided in a surface of said drain region.

5. The lateral high-voltage transistor according to claim 1, wherein
said first conductive type is P-type,
said second conductive type is N-type.

6. A method for manufacturing a lateral high-voltage transistor,
said lateral high-voltage transistor comprising:
a semiconductor substrate having a first conductive type;
a semiconductor layer having a second conductive type, said semiconductor layer being provided on one main surface of said semiconductor substrate;
a source region having the first conductive type, said source region being provided selectively in a surface of said semiconductor layer;
a drain region having the first conductive type, said drain region being provided selectively in the surface of said semiconductor layer such that said drain region is spaced apart from said source region;
a gate electrode provided on a part of said semiconductor layer between said source region and said drain region with interposition of a gate insulating film such that one end of said gate electrode overlaps said source region in a plan view; and a drift region having the first conductive type, said drift region being provided selectively in the surface of said semiconductor layer such that one end of said drift region is connected to said drain region and the other end of said drift region overlaps the other end of said gate electrode in a plan view, wherein said drift region includes a stripe-shaped diffusion layer extending in parallel with a direction from said drain region toward said source region, said stripe-shaped diffusion layer includes linear diffusion layers each including stripe-shaped diffusion regions that are adjacent to each other such that double diffusion occurs in a portion where said stripe-shaped diffusion regions overlap each other, said method comprising the steps of:
(a) preparing said semiconductor substrate;
(b) forming said semiconductor layer on one main surface of said semiconductor substrate;
(c) covering said semiconductor layer with a mask and performing ion-implantation; and
(d) after said step (c), performing a heat treatment to form said linear diffusion layers, wherein said mask includes a plurality of slit groups formed at an interval equal to or larger than an interval L2, each of said slit groups includes a plurality of slits formed at an interval equal to or less than an interval L1, said interval L1 is such an interval that said diffusion regions corresponding to said adjacent slits are connected in said step (d), said interval L2 is such an interval that said diffusion layers corresponding to said adjacent slit groups are not connected in said step (d).

7. The method for manufacturing the lateral high-voltage transistor according to claim 6, wherein
an interval between said slit groups is set to be a constant value equal to or greater than L2,
an interval between said slits is set to be a constant value equal to or less than L1.

8. The method for manufacturing the lateral high-voltage transistor according to claim 6, wherein
said plurality of slits are formed intermittently with respect to a direction in which said slits extend,
an interval of intermittence of said slits is such an interval that, in said step (d), at least said diffusion regions are connected in the direction in which said slits extend.

9. The method for manufacturing the lateral high-voltage transistor according to claim 6, wherein
said slit has a width of 1 μm or less.

* * * * *